(12) United States Patent
Yano et al.

(10) Patent No.: US 11,781,779 B2
(45) Date of Patent: Oct. 10, 2023

(54) VENTILATION MEMBER

(71) Applicant: NITTO DENKO CORPORATION, Ibaraki (JP)

(72) Inventors: Youzou Yano, Osaka (JP); Yusuke Nakayama, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 735 days.

(21) Appl. No.: 16/608,652

(22) PCT Filed: Apr. 25, 2018

(86) PCT No.: PCT/JP2018/016877
§ 371 (c)(1),
(2) Date: Oct. 25, 2019

(87) PCT Pub. No.: WO2018/199192
PCT Pub. Date: Nov. 1, 2018

(65) Prior Publication Data
US 2020/0088440 A1    Mar. 19, 2020

(30) Foreign Application Priority Data
Apr. 28, 2017  (JP) .................................. 2017-090376

(51) Int. Cl.
*F24F 13/08* (2006.01)
*F24F 11/89* (2018.01)
(Continued)

(52) U.S. Cl.
CPC .......... *F24F 13/085* (2013.01); *B60H 1/241* (2013.01); *F24F 11/89* (2018.01); *F24F 7/065* (2013.01)

(58) Field of Classification Search
CPC .......... F24F 13/085; F24F 11/89; F24F 7/065; B60H 1/241
(Continued)

(56) References Cited

U.S. PATENT DOCUMENTS

| | | |
|---|---|---|
| 2003/0220067 A1 | 11/2003 | Mashiko et al. |
| 2009/0047890 A1 | 2/2009 | Yano et al. |

(Continued)

FOREIGN PATENT DOCUMENTS

| | | |
|---|---|---|
| CN | 101312854 | 11/2008 |
| JP | S39-037172 Y1 | 12/1964 |

(Continued)

OTHER PUBLICATIONS

Office Action issued for Chinese Patent Application No. 201880027933.6, dated Jun. 1, 2020, 20 pages including English translation.

(Continued)

*Primary Examiner* — Allen R. B. Schult
(74) *Attorney, Agent, or Firm* — Hamre, Schumann, Mueller & Larson, P.C.

(57) ABSTRACT

A ventilation member of the present disclosure comprises: a support having a through hole that serves as an air passage between inside and outside of a housing upon attaching the support to an opening of the housing; and an air-permeable membrane disposed on the support and closing the through hole. The support comprises: a supporting portion in which the through hole is provided and at which the air-permeable membrane is disposed, and an insertion portion extending from the supporting portion and having an end with a hook, wherein the insertion portion bends in a direction closer to a central axis of the ventilation member while the hook is passing through the opening by being inserted into the opening, and fixes the ventilation member to the opening with the hook engaging the housing after passing through (Continued)

the opening. The ventilation member has a stopper portion with which bending of the insertion portion in the direction is restricted within an elastically deformable range of the insertion portion during the insertion into the opening. A ventilation member of the present disclosure can be reliably fixed to an opening of a housing with the insertion portion, even when the insertion portion is inserted into the opening at an angle.

4 Claims, 13 Drawing Sheets

(51) Int. Cl.
*B60H 1/24* (2006.01)
*F24F 7/06* (2006.01)

(58) Field of Classification Search
USPC .......................................................... 454/120
See application file for complete search history.

(56) References Cited

U.S. PATENT DOCUMENTS

| | | | |
|---|---|---|---|
| 2014/0290488 A1* | 10/2014 | Uemura | ............... H05K 5/0213 96/4 |
| 2014/0290489 A1 | 10/2014 | Uemura et al. | |

FOREIGN PATENT DOCUMENTS

| | | |
|---|---|---|
| JP | S58-036613 U1 | 3/1983 |
| JP | S60-115593 U1 | 8/1985 |
| JP | 2004-047425 A | 2/2004 |
| JP | 2014-191898 A | 10/2014 |
| JP | 2014-222694 A | 11/2014 |

OTHER PUBLICATIONS

International Search Report and Written Opinion issued for International Patent Application No. PCT/JP2018/016877, dated Jul. 31, 2018, 17 pages including English translation.

* cited by examiner

VENTILATION MEMBER

TECHNICAL FIELD

The present invention relates to a ventilation member to be attached to an opening of a housing.

BACKGROUND ART

There are instances where a ventilation member is attached to the housing of various devices and components, including, for example, automotive electrical/electronic components such as lamps, inverters, converters, ECUs (Electronic Control Units), battery packs, radars, and cameras, and a variety of household, medical, and office electronics, in order to ensure ventilation of the housing, and to reduce pressure fluctuations in the housing. Aside from ventilation, a ventilation member is also required to satisfy a range of properties that depend on the specific type of electrical/electronic component or device to which the ventilation member is to be attached. Examples of such properties include dustproofness against entry of dust, waterproofness against entry of water, and oilproofness against entry of oil into the housing, and the property to prevent entry of salt into the housing (CCT salt resistance).

Patent Literature 1 discloses a ventilation member that conceivably satisfies ventilation and other required properties. FIG. 13 shows a ventilation member disclosed in Patent Literature 1.

The ventilation member 101 shown in FIG. 13 includes a support 102 and an air-permeable membrane 104. The support 102 has a supporting portion 102a for supporting the air-permeable membrane 104, and an insertion portion 102b formed on one side of the supporting portion 102a. The supporting portion 102a has a through hole 103 formed through the center of the supporting portion 102a, and the air-permeable membrane 104 is disposed on the supporting portion 102a so as to cover the through hole 103. The insertion portion 102b is columnar in shape with substantially the same diameter as the diameter of the opening 108 of a housing 107, and is divided into a plurality of portions along the circumference. The insertion portion 102b has six leg portions 102h. Three of the six leg portions 102h have hooks 102c. The leg portions 102h having hooks 102c, and the leg portions 102h having no hooks 102c are alternately disposed along the circumference. The leg portions 102h with no hooks 102c are provided to improve the stability of the ventilation member 101 after fixing to the opening 108. To this end, the outer circumferential surfaces of the leg portions 102h having no hooks 102c, and the outer circumferential surfaces of the insertion portion 102h having hooks 102c lie on the same imaginary circle centered on the central axis 110 of the ventilation member 101 when the leg portions 102h are viewed along the central axis 110 from the end side of the leg portions 102h.

The insertion portion 102b is inserted into the opening 108 to fix the ventilation member 101 to the opening 108. In inserting the insertion portion 102b into the opening 108, the leg portions 102h having hooks 102c bend toward the central axis 110 of the ventilation member 101 as the hooks 102c contact the wall surface of the opening 108. Pushing the ventilation member 101 further into the opening 108 moves the hooks 102c through the opening 108, and removes the bend acting on the leg portions 102h in the foregoing direction. With the bend removed, the hooks 102c engage the inner surface of the housing 107, and serve as an anchor to fix the ventilation member 101 to the opening 108. A sealing member 109 is disposed between the housing 107 and the support 102.

CITATION LIST

Patent Literature

Patent Literature 1: JP 2004-47425 A

SUMMARY OF INVENTION

Technical Problem

In fixing the ventilation member 101 to the opening 108, there are cases where the insertion portion 102b is inserted into the opening 108 at an angle. This is particularly the case when fixing the ventilation member 101 to an opening 108 that cannot be visually located, or to an opening 108 formed in a slanting surface of the housing, or when the opening 108 is not suited for automated machine-aided insertion and fixing of the ventilation member 101. In this case, the leg portion 102h that has contacted the wall surface of the opening 108 first has the largest bend among the other leg portions 102h having hooks 102c. Here, if the ventilation member 101 were pushed further without correcting the insertion direction of the insertion portion 102b, the leg portion 102h that first contacted the wall surface becomes damaged as a result of being subjected to an excessively large bend. When damaged, the leg portion 102h remains bent even after its hook 102c passed through the opening 108, and the hook 102c has trouble securely engaging the inner surface of the housing 107. In an extreme case, the leg portion 102h placed under an excessively large bend breaks away from the support 102.

It is accordingly an object of the present invention to provide a ventilation member that can be securely fixed to an opening of a housing with an insertion portion having a hook, even when the insertion portion, which is inserted into the housing opening to fix the ventilation member, is inserted into the opening at an angle.

Solution to Problem

The present invention provides a ventilation member to be attached to an opening of a housing, the ventilation member comprising:

a support having a through hole that serves as an air passage between inside and outside of the housing upon attaching the support to the opening; and an air-permeable membrane disposed on the support and closing the through hole, the support comprising:

a supporting portion in which the through hole is provided and at which the air-permeable membrane is disposed, and an insertion portion extending from the supporting portion and having an end with a hook, wherein the insertion portion bends in a direction closer to a central axis of the ventilation member while the hook is passing through the opening by being inserted into the opening, and fixes the ventilation member to the opening with the hook engaging the housing after passing through the opening, the ventilation member having a stopper portion with which bending of the insertion portion in the direction is restricted within an elastically deformable range of the insertion portion during the insertion into the opening.

Advantageous Effects of Invention

In a ventilation member of the present invention, the stopper portion can restrict bending of the insertion portion within the elastically deformable range of the insertion portion when the insertion portion having a hook bends in the direction during the insertion into the opening. The bend in the elastically deformable range of the insertion portion can be reliably removed after the hook has passed through the opening. This enables a ventilation member of the present invention to be reliably fixed to an opening of a housing with the insertion portion, even when the insertion portion, having a hook, is inserted into the housing opening at an angle.

DESCRIPTION OF EMBODIMENTS

Figure 1:
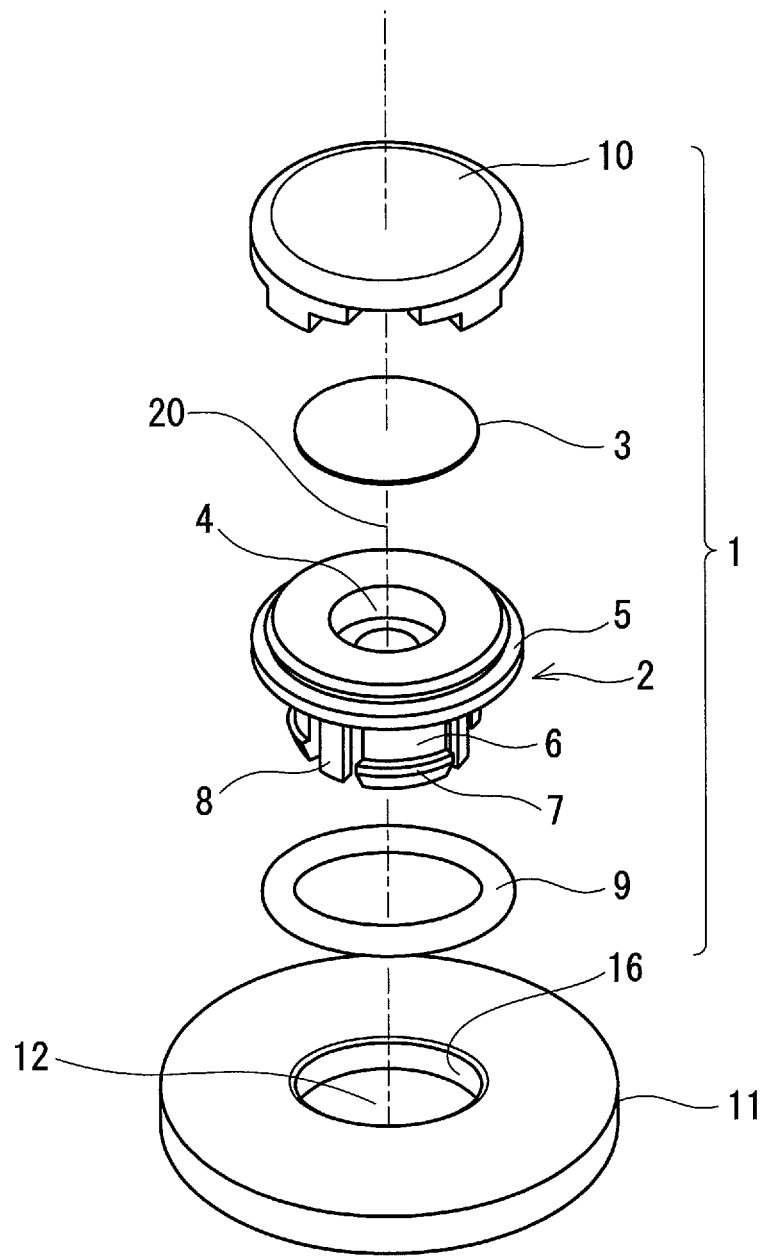
FIG. 1 is an exploded perspective view representing an example of a ventilation member of the present invention.

Embodiments of the present invention are described below, with reference to the accompanying drawings.

A ventilation member of a first aspect of the present disclosure is a ventilation member to be attached to an opening of a housing, the ventilation member comprising:
a support having a through hole that serves as an air passage between inside and outside of the housing upon attaching the support to the opening; and
an air-permeable membrane disposed on the support and closing the through hole,
the support comprising:
a supporting portion in which the through hole is provided and at which the air-permeable membrane is disposed, and
an insertion portion extending from the supporting portion and having an end with a hook, wherein the insertion portion bends in a direction closer to a central axis of the ventilation member while the hook is passing through the opening by being inserted into the opening, and fixes the ventilation member to the opening with the hook engaging the housing after passing through the opening,
the ventilation member having a stopper portion with which bending of the insertion portion in the direction is restricted within an elastically deformable range of the insertion portion during the insertion into the opening.

In a second aspect of the present disclosure, the ventilation member of the first aspect of the present disclosure is such that the supporting portion has the stopper portion, independently from the insertion portion, and the stopper portion restricts bending of the insertion portion in the direction within the elastically deformable range of the insertion portion by making contact with the insertion portion bending in the direction during the insertion into the opening.

In a third aspect of the present disclosure, the ventilation member of the second aspect of the present disclosure is such that the stopper portion is a columnar portion extending from the supporting portion.

In a fourth aspect of the present disclosure, the ventilation member of the second or third aspect of the present disclosure is such that the support has two or more of the insertion portions,
said two or more of the insertion portions being disposed to overlap an imaginary circle centered on the central axis and being separated from one another along the circle as viewed along the central axis from the end side of the insertion portions,
the stopper portion being disposed to overlap the circle and lie between the insertion portions that are adjacent one another along the circle, as viewed along the central axis from the end side of the insertion portions.

In a fifth aspect of the present disclosure, the ventilation member of the fourth aspect of the present disclosure is such that an imaginary circle centered on the central axis and contacting an outer circumferential surface of the stopper portion has a diameter equal to or less than the diameter of an imaginary circle centered on the central axis and contacting outer circumferential surfaces of the insertion portions, as viewed along the central axis from the end side of the insertion portions.

In a sixth aspect of the present disclosure, the ventilation member of the second or third aspect of the present disclosure is such that the stopper portion is disposed between the insertion portion and the central axis, or overlaps the central axis, as viewed along the central axis from the end side of the insertion portion.

In a seventh aspect of the present disclosure, the ventilation member of the sixth aspect of the present disclosure is such that the stopper portion is disposed to overlap the through hole as viewed along the central axis from the end side of the insertion portion.

In an eighth aspect of the present disclosure, the ventilation member of the seventh aspect of the present disclosure is such that inside of the stopper portion has the air passage being in communication with the through hole.

In a ninth aspect of the present disclosure, the ventilation member of the first aspect of the present disclosure is such that the support has two or more of the insertion portions, said two or more of the insertion portions each having the stopper portion, and said two or more of the insertion portions upon being equally bent in the direction and upon the stopper portions of the adjacent insertion portions making contact with one another having a bend directed in the direction and confined within the elastically deformable range.

In a tenth aspect of the present disclosure, the ventilation member of the ninth aspect of the present disclosure is such that the stopper portions are located at side surfaces of the insertion portions.

In an eleventh aspect of the present disclosure, the ventilation member of the ninth or tenth aspect of the present disclosure is such that said two or more of the insertion portions are disposed to overlap an imaginary circle centered on the central axis and are separated from one another along the circle, as viewed along the central axis from the end side of the insertion portions.

In a twelfth aspect of the present disclosure, the ventilation member of any one of the first to eleventh aspects of the present disclosure is such that the insertion portion has an inner side surface having a portion that protrudes into an inner side of an imaginary circle centered on the central axis and running through end portions of the inner side surface in a width direction of the inner side surface, as viewed along the central axis from the end side of the insertion portion.

In a thirteenth aspect of the present disclosure, the ventilation member of the twelfth aspect of the present disclosure is such that the inner side surface is a flat surface.

In a fourteenth aspect of the present disclosure, the ventilation member of any one of the first to thirteenth aspects of the present disclosure is such that the ventilation member further comprises a sealing member disposed around the insertion portion.

In a fifteenth aspect of the present disclosure, the ventilation member of any one of the first to fourteenth aspects of the present disclosure is such that the ventilation member further comprises a protecting cover for protecting the air-permeable membrane.

The descriptions below are not intended to limit the present invention to the specific embodiments. As used herein, "stopper portion" may be a structural portion independently provided in the ventilation member (or the support), specifically for the purpose of restricting the bendable range of the insertion portion, or may be a part of the insertion portion or other members (the form of the part is not limited, and may be, for example, a dot, a line, or a surface), restricting the bendable range of the insertion portion or other members as a result of bending.

First Embodiment

FIGS. 1 and 2 and FIGS. 3A to 3C show a ventilation member 1 of First Embodiment. The ventilation member 1 is attached to a ventilation opening 12 of a housing 11, from outside of the housing 11. The ventilation member 1 has a support 2 and an air-permeable membrane 3. The support 2 has a through hole 4, which serves as an air passage communicating between inside and outside of the housing 11 upon attaching the ventilation member 1 to the opening 12. The air-permeable membrane 3 is covering the through hole 4 at one open end of the through hole 4, specifically, at the open end outside of the housing 11. The air-permeable membrane 3 is a membrane that allows for passage of gases in a thickness direction while preventing foreign substances from passing through the membrane. With the air-permeable membrane 3, the ventilation member 1 is able to block entry of foreign substances, such as dust, water, oil, and salt, into inside of the housing 11 while ensuring ventilation between inside and outside of the housing 11. In the present embodiment, the air-permeable membrane 3 is circular in shape. However, the shape of the air-permeable membrane 3 is not limited, and the air-permeable membrane 3 may have, for example, a polygonal shape.

The support 2 has a supporting portion 5 in which the through hole 4 is provided and on which the air-permeable membrane 3 is disposed. The support 2 also has an insertion portion 6 extending from the supporting portion 5. The supporting portion 5 has an approximately disk shape. The insertion portion 6 is formed on one side of the supporting portion 5, and extending in a direction substantially perpendicular to the surface of the supporting portion 5 on which the insertion portion 6 is formed. In this specification, the surface of the supporting portion 5 on which the insertion portion 6 is formed is referred to as "bottom surface", and the surface opposite the bottom surface is referred to as "top surface". The air-permeable membrane 3 is disposed on the top surface of the supporting portion 5. Similarly, as used herein, the term "below" is used to refer to a position on the side of the insertion portion 6 extending away from the supporting portion 5, and the term "above" is used to refer to a position on the opposite side relative to the supporting portion 5. The shape of the supporting portion 5 is not limited to an approximately disk shape, provided that the supporting portion 5 has the through hole 4, and that the air-permeable membrane 3 can be disposed on the supporting portion 5. The direction of extension of the insertion portion 6 may be inclined with respect to a direction substantially perpendicular to the bottom surface of the supporting portion 5, provided that the ventilation member 1 can be fixed to the opening 12.

The ventilation member 1 is fixed to the opening 12 by inserting the insertion portion 6 into the circular opening 12 from outside of the housing 11. The support 2 has two or more insertion portions 6 (6a, 6b, 6c). The insertion portions 6 are disposed by being equally spaced apart along a circle 13, with the outer circumferential surfaces 15 of the insertion portions 6 lying on the circle 13, as viewed from below along the central axis 20 of the ventilation member 1. The circle 13 is an imaginary circle centered on the central axis 20 of the ventilation member 1, sharing the same center as the opening 12. The insertion portions 6 are disposed in a circular region 14 having the same circumference as the imaginary circle 13. In the embodiment illustrated in the drawings, the diameter of the circle 13 is smaller than the diameter of the opening 12. The insertion portions 6 may be disposed by being unequally spaced apart along the circle 13, with the outer circumferential surfaces 15 of the insertion portions 6 lying on the circle 13, as viewed from below along the central axis 20. The insertion portions 6 are disposed so as to surround the through hole 4, as viewed from below along the central axis 20, and the space surrounded by the insertion portions 6 provides an air passage between inside and outside of the housing 11.

The insertion portions 6 have flat inner side surfaces 17, as opposed to the round outer circumferential surfaces 15. This form is preferable because it provides a large cross sectional area for the insertion portion 6 (in a cross section perpendicular to the direction of extension of the insertion portion 6), and more reliably restricts the bending of the insertion portion 6 during the insertion into the opening 12. The inner side surfaces 17 of the insertion portions 6 may be formed along a circle 31, which is an imaginary circle centered on the central axis 20 of the ventilation member 1 and running through both end portions 18a and 18b of the width of each inner side surface 17 (on a plane perpendicular to the direction of extension of the insertion portions 6), as viewed from below along the central axis 20. Preferably, the insertion portion 6 has a portion that protrudes into the inner side of the circle 31, as viewed from below along the central axis 20. The insertion portions 6 of the embodiment illustrated in the drawings have such protrusions.

The insertion portions 6 each have a hook 7 at the tip. The hooks 7 pass through the opening 12, and engage the housing 11 as a result of insertion of the insertion portions 6 into the opening 12. As a result of the hooks 7 engaging the housing 11, the ventilation member 1 becomes fixed to the opening 12, and does not detach itself from the opening 12. In the present embodiment, the insertion portions 6 are inserted from outside of the housing 11, and the hooks 7 engage the inner surface of the housing 11. The hook 7 is shaped to protrude outwardly from the outer circumferential surface 15 of the insertion portion 6, away from the central axis 20. In the insertion portions 6a, 6b, and 6c, the hook 7 of each insertion portion 6 has a protruding end 19 that lies on the same circle 32, as viewed from below along the central axis 20. The circle 32 is an imaginary circle centered on the central axis 20 of the ventilation member 1, and has a larger diameter than the opening 12. The hook 7 has portions 22a where the distance (width) from one side surface 22 to the other side surface 22 is the largest, as viewed from below along the central axis 20. The portions 22a lie between a joint portion 15a, where the hook 7 joins the outer circumferential surface 15, and the protruding end 19.

The insertion portions 6 bend in a direction closer to the central axis 20 of the ventilation member 1 while the hooks 7 are passing through the opening 12. Bending of the insertion portions 6 occur as a result of the hooks 7 contacting and being pressed against the wall surface 16 of the opening 12 upon inserting the insertion portions 6 into the opening 12. Because the insertion portions 6 bend in this direction, the hooks 7 are able to pass through the opening 12 when the insertion portions 6 are inserted into the opening 12.

The ventilation member 1 of the present embodiment has three insertion portions 6a, 6b, and 6c. However, the ventilation member 1 may have any number of insertion portions 6. The ventilation member 1 of the present embodiment has, for example, two to six insertion portions 6. Preferably, the ventilation member 1 of the present embodiment has three or four insertion portions 6 because it enables the ventilation member 1 to be stably fixed by preventing detachment from the opening 12 while allowing the ventilation member 1 to be inserted into the opening 12 with small resistance.

Figure 4A:
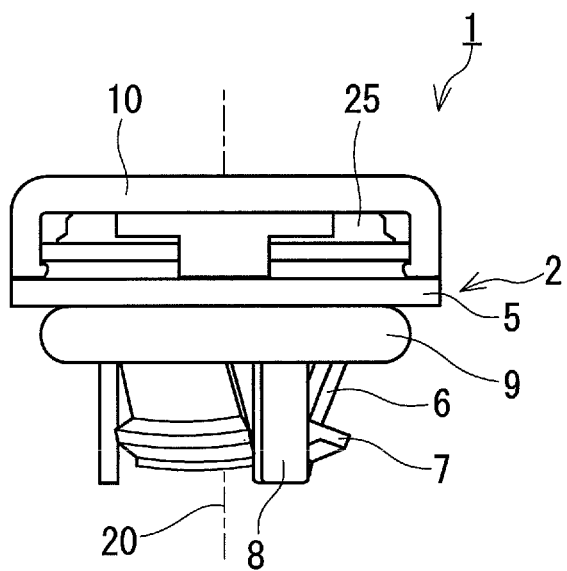
FIG. 4A is a side view showing stopper portions stopping a bend in insertion portions in the ventilation member of FIGS. 3A to 3C.
Figure 4B:
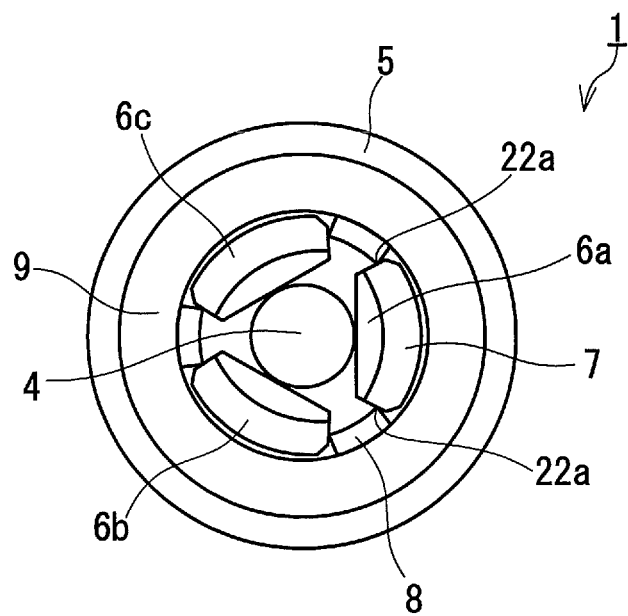
FIG. 4B is a bottom view showing stopper portions stopping a bend in insertion portions in the ventilation member of FIGS. 3A to 3C.
Figure 4C:
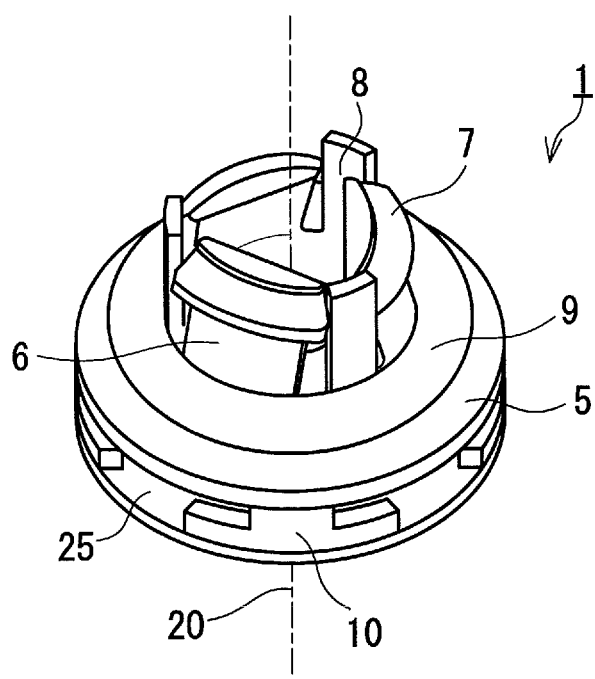
FIG. 4C is a perspective view showing stopper portions stopping a bend in insertion portions in the ventilation member of FIGS. 3A to 3C.

The ventilation member 1 of the present embodiment, more specifically, the supporting portion 5, also has stopper portions 8, independently from the insertion portions 6. The stopper portions 8 are columnar portions extending from the supporting portion 5. With the stopper portions 8, the insertion portions 6 having bent in the direction closer to the central axis 20 upon being inserted into the opening 12 make contact with the stopper portions 8, and the stopper portions 8 restrict the bending of the insertion portions 6 in the direction within the elastically deformable range of the insertion portions 6 (see FIGS. 4A to 4C). FIGS. 4A to 4C represent bending of the insertion portions 6 being restricted in this range by the stopper portions 8 contacting the insertion portions 6.

Figure 5:
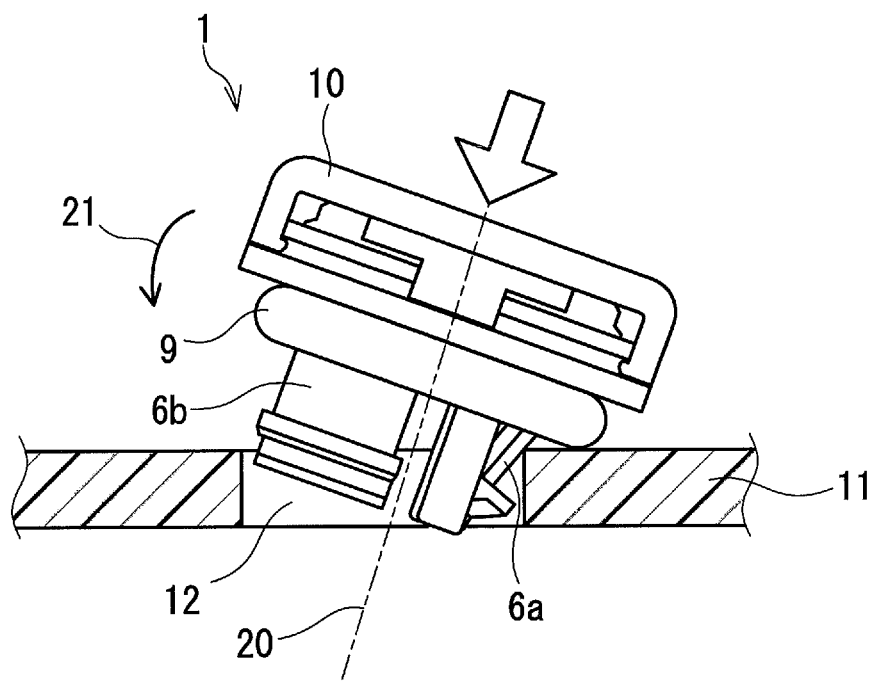
FIG. 5 is a partial cross sectional view representing an example of a ventilation member of the present invention with insertion portions being inserted into the opening at an angle.

As illustrated in FIG. 5, when the insertion portions 6 are inserted into the opening 12 at an angle, the insertion portion 6a having contacted the wall surface 16 of the opening 12 first bends in the afore-mentioned direction by a larger amount than the other insertion portions 6b and 6c. When the ventilation member 1 is pushed further into the opening 12, the insertion portion 6a bends further in the direction closer to the central axis 20. However, the bending of the insertion portion 6a is restricted within its elastically deformable range by the stopper portions 8 that come into contact with the insertion portion 6a. The same restrictions can occur in the other insertion portions 6b and 6c, and the bends in the insertion portions 6a, 6b, and 6c are reliably removed after the hooks 7 pass through the opening 12.

Once the stopper portions 8 contacted the insertion portion 6a, as shown in FIG. 5, an attempt to push the ventilation member 1 further into the opening 12 without having to correct the insertion direction of the insertion portions 6 into the opening 12 results in the applied force acting as a force 21 that changes and straightens the insertion direction relative to the opening 12. That is, the ventilation member 1 is able to correct the insertion direction of the insertion portions 6 by itself. Even when the ventilation member 1 fails to self-correct the insertion direction because of an interference between members, a person or a device attaching the ventilation member 1 is able to correct the insertion direction upon detecting a force produced by such an interference. In this way, all insertion portions 6 can be inserted into the opening 12 with the bending being kept within the elastically deformable range of the insertion portions 6.

Figure 3A:
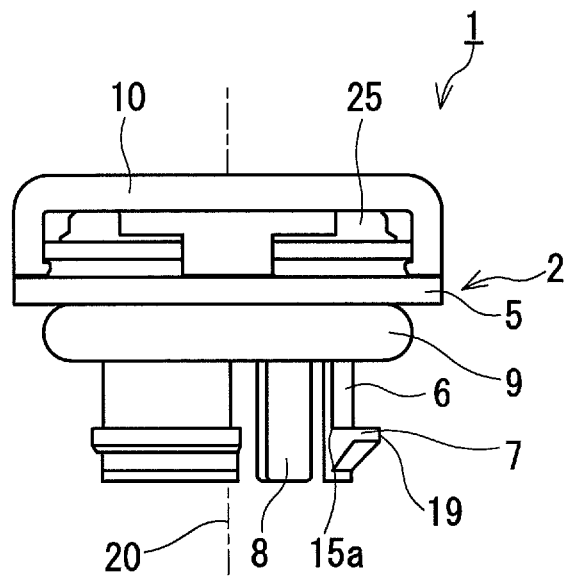
FIG. 3A is a side view representing an example of the ventilation member of the present invention.
Figure 3B:
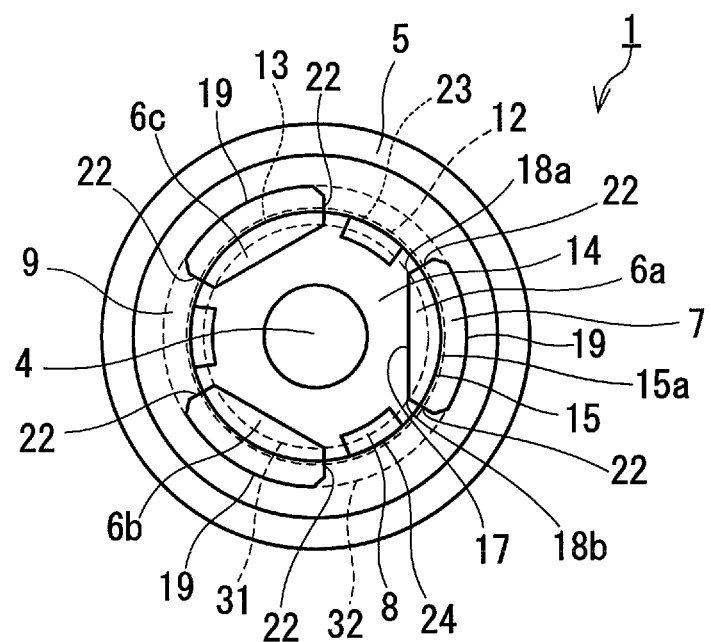
FIG. 3B is a bottom view of the ventilation member shown in FIG. 3A.
Figure 3C:
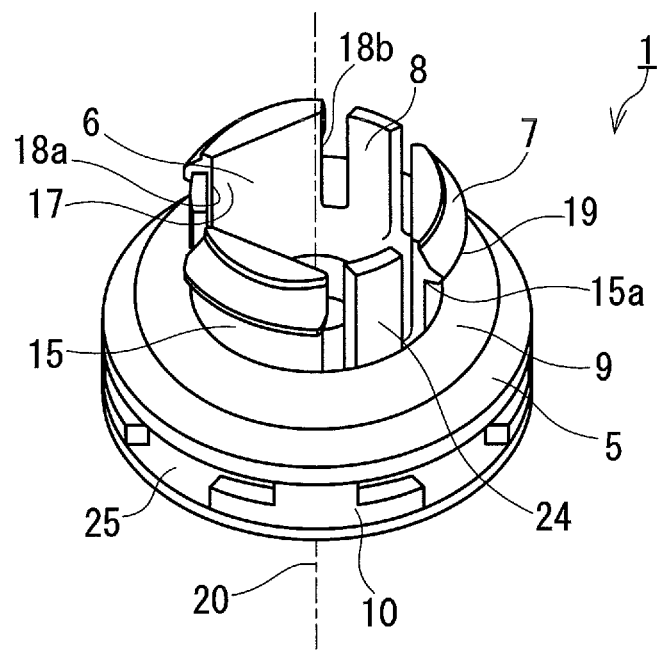
FIG. 3C is a perspective view of the ventilation member shown in FIG. 3A.

As shown in FIG. 3A to 3C, the stopper portions 8 are disposed between the side surfaces 22 of the adjacent insertion portions 6 lying along the circle 13, as viewed from below along the central axis 20. The stopper portions 8 overlap the circle 13, and have outer circumferential surfaces 24 lying on a circle 23, as viewed from below along the central axis 20. The circle 23 is an imaginary circle centered on the central axis 20 of the ventilation member 1.

The circle 23 of the embodiment illustrated in the drawings has the same diameter as the circle 13 on which the outer circumferential surfaces 15 of the insertion portions 6 lie. The circle 23 may have a smaller diameter than the circle 13. In the embodiment illustrated in the drawings, the hooks 7 of the insertion portions 6 contact the stopper portions 8 upon the insertion portions 6 making a large bend in the direction closer to the central axis 20. In the ventilation member 101 of Patent Literature 1, the leg portions 120h having hooks 102c and the leg portions 102h having no hooks 102c do not make contact with each other even when the leg portions 102h having hooks 102c make a large bend when inserted into the opening 108.

The stopper portions 8 of the present embodiment are shaped so that the width of each stopper portion 8 perpendicular to its direction of extension is constant in this direction. It is to be noted, however, that the width of the stopper portion 8 is regarded as being constant even when it involves fluctuations, for example, ±0.3 mm, in the direction of extension that are unavoidable for technical reasons attributed to the way the stopper portions 8 are shaped. In the present embodiment, the stopper portions 8 are equal in length to the insertion portions 6 along the direction of extension of these portions. The lengths of stopper portions 8 and the lengths of insertion portions 6 are regarded as being the same when the difference is within, for example, ±0.3 mm.

Figure 6:
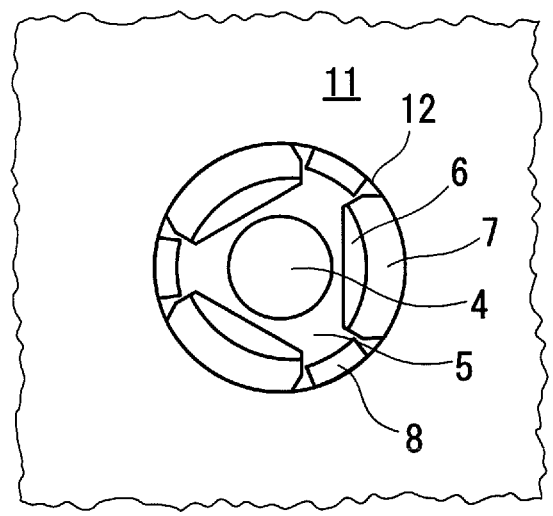
FIG. 6 is a plan view representing an example of a ventilation member of the present invention during the passage through an opening of a housing.

As shown in FIG. 6, the insertion portions 6 and the stopper portions 8 may be shaped and disposed so that all insertion portions 6 and stopper portions 8 do not make contact with each other when all hooks 7 are passing through the opening 12. In this case, the insertion portions 6 and the stopper portions 8 are separated from each other with a clearance of, for example, 0.2 mm or less when all the hooks 7 have their protruding ends 19 contacting the wall surface 16 of the opening 12.

Figure 2:
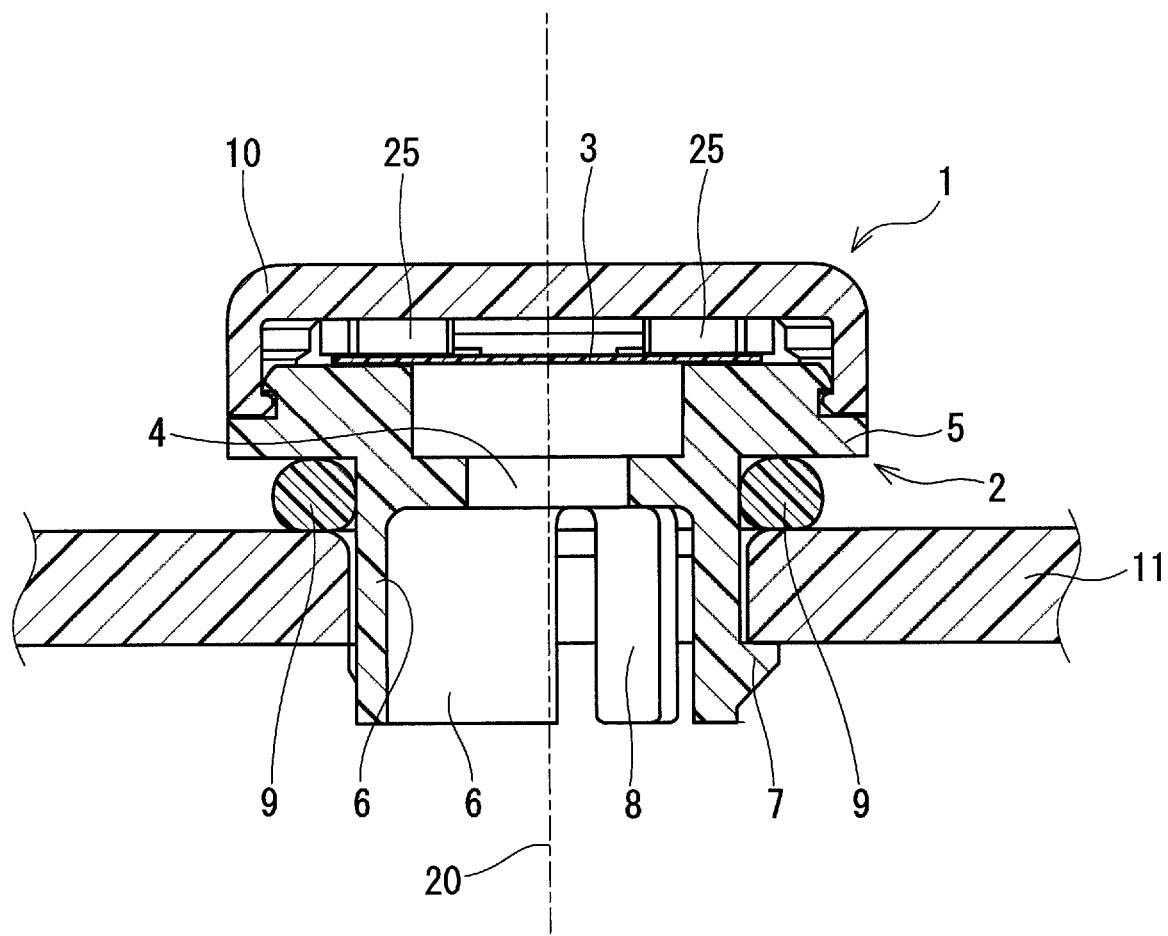
FIG. 2 is a cross sectional view representing an example of the ventilation member of the present invention.

The ventilation member 1 also includes a sealing member 9 disposed so as to surround the insertion portions 6. With the ventilation member 1 fixed to the opening 12, the sealing member 9 is between the bottom surface of the supporting portion 5 and the outer surface of the housing 11, preventing passage of air in and out of the housing 11 in portions other than the through hole 4. This makes it possible to more reliably prevent entry of foreign substances, such as dust, water, oil, and salt, into the housing 11 through the opening 12. The sealing member 9 of the present embodiment is an elastic sealing ring having a circular cross section. The sealing ring provides more reliable sealing when the support 2 is designed to make the sealing ring compressible with the ventilation member 1 fixed to the opening 12. When compressed, the sealing ring exerts a force that pushes up the supporting portion 5, securing the ventilation member 1 even more firmly with the hooks 7, and more reliably preventing detachment of the ventilation member 1. FIG. 2 depicts the sealing member 9 (sealing ring) being compressed.

In the case the sealing member 9 is provided at the time of fixing the ventilation member 1 to the opening 12 of the housing 1, the ventilation member 1 may be distributed without the sealing member 9.

The ventilation member 1 also includes a protecting cover 10 for protecting the air-permeable membrane 3. The protecting cover 10 is disposed on the top surface of the supporting portion 5, covering the air-permeable membrane 3. With the protecting cover 10, the air-permeable membrane 3 is protected from damage caused by foreign substances such as water splashed from outside. As shown in FIG. 2, the protecting cover 10 has a plurality of openings 25 in its side surface, allowing discharge of foreign substances that have entered the protecting cover 10.

The air-permeable membrane 3 may be resin or metal in the form of a woven fabric, a nonwoven fabric, a mesh, or a net, or may be a porous resin membrane. The air-permeable membrane 3 is not limited, as long as it allows gases to pass through, and blocks passage of foreign substances such as liquids. In the present embodiment, the air-permeable membrane 3 is a laminate of a porous resin membrane and a ventilating reinforcement layer. The air-permeable membrane 3 can have improved strength with the reinforcement layer. The porous resin membrane is, for example, a porous fluororesin material or a porous polyolefin material, which can be produced by using a known technique such as stretching or extraction. Examples of the fluororesin include polytetrafluoroethylene (PTEF), polychlorotrifluoroethylene, a tetrafluoroethylene-hexafluoropropylene copolymer, a tetrafluoroethylene-perfluoroalkyl vinyl ether copolymer, and a tetrafluoroethylene-ethylene copolymer. Examples of the constituent monomers of the polyolefin include ethylene, propylene, and 4-methylpentene-1,1-butene. Polyolefins as homopolymers or copolymers of these monomers are usable for the air-permeable membrane 3. The air-permeable membrane 3 may be made of a porous nanofiber film material using polyacrylonitrile, nylon, or polylactic acid. Particularly preferred as the air-permeable membrane 3 is a porous PTFE material, which provides ventilation even with a small area, and has good blocking performance against entry of foreign substance into the housing 11. The porous PTFE material has an average pore diameter of preferably 0.01 μm to 10 μm. The reinforcement layer is, for example, resin or metal in the form of a woven fabric, a nonwoven fabric, a mesh, a net, a sponge, a foam, or a porous material. The lamination of the porous resin membrane and the reinforcement layer can be achieved using various techniques, including, for example, adhesive lamination, heat lamination, heat welding, ultrasonic welding, and bonding with an adhesive.

The air-permeable membrane 3 may be subjected to a liquid-repellent treatment. This may be achieved by applying to the air-permeable membrane a liquid-repellent agent containing a low-surface-tension substance, and drying the coating film formed by the liquid-repellent agent. The aforementioned substance contained in the liquid-repellent agent is, for example, a polymer having a perfluoroalkyl group. The liquid-repellent agent may be applied using various techniques, including, for example, air spraying, electrostatic spraying, dip coating, spin coating, roll coating, curtain flow coating, and impregnation.

The thickness of the air-permeable membrane 3 may be adjusted within a range of, for example, 1 μm to 5 mm, taking into account the strength, and ease of fixing to the supporting portion 5. The air permeability of the air-permeable membrane 3 is, for example, 0.1 to 300 sec/100 mL in terms of an air permeability (Gurley air permeability) measured in compliance with the air-permeability measurement method B (Gurley method) specified in JIS (Japanese Industrial Standards) L 1096.

The air-permeable membrane 3 may be bonded to the supporting portion 5. This may be achieved using various welding techniques, including, for example, heat welding, ultrasonic welding, and laser welding. The air-permeable membrane 3 may be disposed on the supporting portion 5 by insert molding of the support 2 using the air-permeable membrane 3 as a pre-placed insert.

The support 2, including the supporting portion 5 and the insertion portions 6, and the protecting cover 10 are formed of resin, for example. These components formed of resin have desirable moldability. These components may be formed by using known molding techniques, for example, such as injection molding, compression molding, and powder molding. Preferably, the supporting portion 5 and the insertion portions 6 of the support 2 are molded as a single unit. For improved productivity in mass production of the ventilation member 1, the support 2 is molded preferably by injection molding. The resin forming the support 2 is typically a thermoplastic resin. Examples of the thermoplastic resin include polyamides (PA; nylon, for example), polybutylene terephthalate (PBT), polyethylene terephthalate (PET), polyphenylene sulfide (PPS), polycarbonate (PC), polypropylene (PP), and polyphenylene ether (PPE). The resin forming the support 2 may contain an additive, which may be, for example, a pigment such as carbon black or titanium white; a reinforcement filler such as a glass particle or a glass fiber; or a water-repellent material. The surfaces of the afore-mentioned members may be subjected to a liquid-repellent treatment. The liquid-repellent treatment may be performed by using any of the various liquid-repellent treatment methods described above in conjunction with the air-permeable membrane 3, or by using other techniques such as electrodeposition coating, and film formation by plasma polymerization.

The protecting cover 10 may be bonded to the support 2. This may be achieved by using various welding techniques, including, for example, heat welding, ultrasonic welding, and laser welding.

The sealing member 9 may be made of an elastomer such as ethylene propylene diene rubber (EPDM), nitrile rubber (NBR), fluororubber, acrylic rubber, hydrogenated nitrile rubber, or silicone rubber.

The housing 11 is made of, for example, resin, metal, or a composite material of these.

Second Embodiment

Figure 7A:
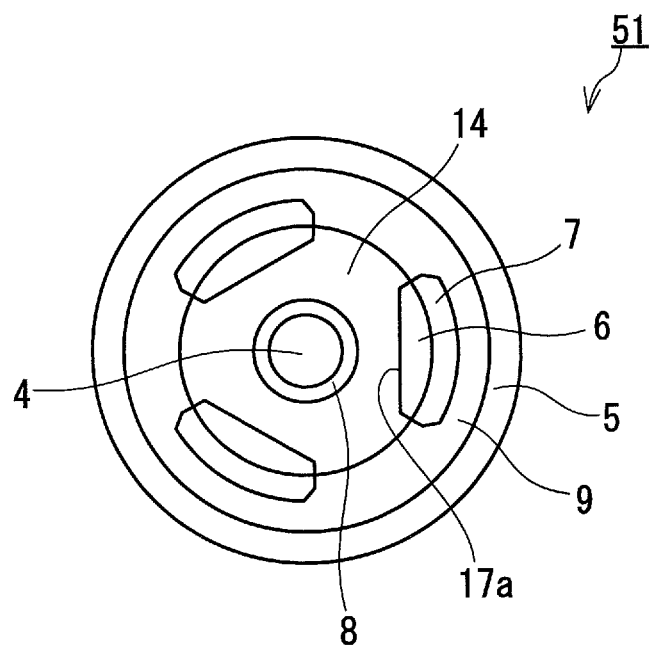
FIG. 7A is a bottom view representing another example of a ventilation member of the present invention.
Figure 7B:
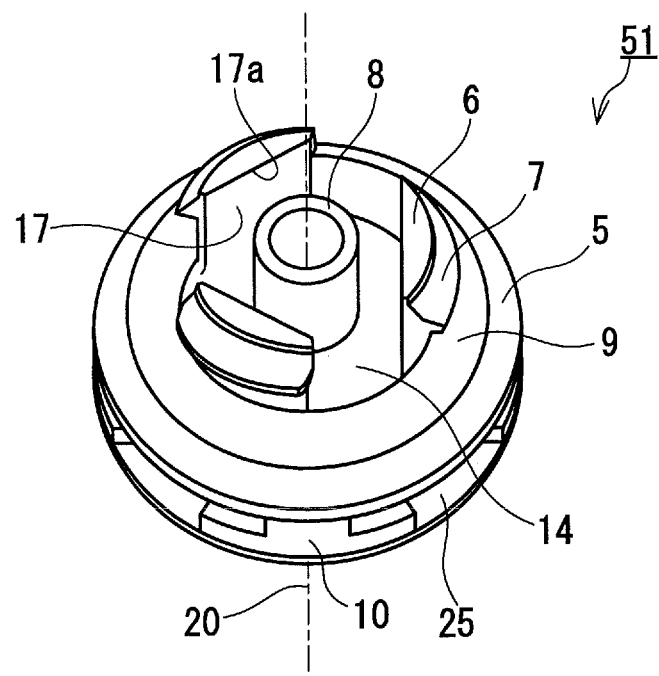
FIG. 7B is a perspective view of the ventilation member shown in FIG. 7A.

FIGS. 7A and 7B show a ventilation member 51 of Second Embodiment. Second Embodiment is the same as First Embodiment, except for the shape and layout of the stopper portion 8 provided as a part of the supporting portion 5 independently from the insertion portions 6. Accordingly, the present embodiment will not be described with regard to features already described in First Embodiment.

Figure 8A:
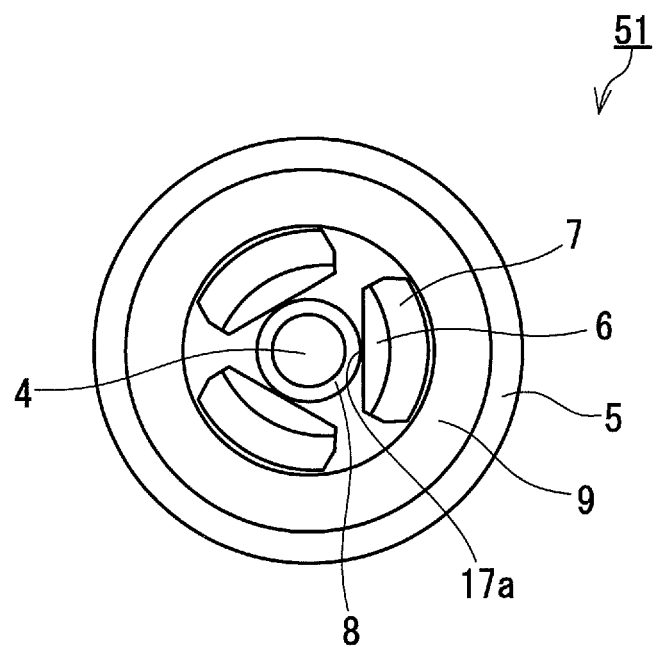
FIG. 8A is a bottom view showing a stopper portion stopping a bend in insertion portions in the ventilation member of FIGS. 7A and 7B.
Figure 8B:
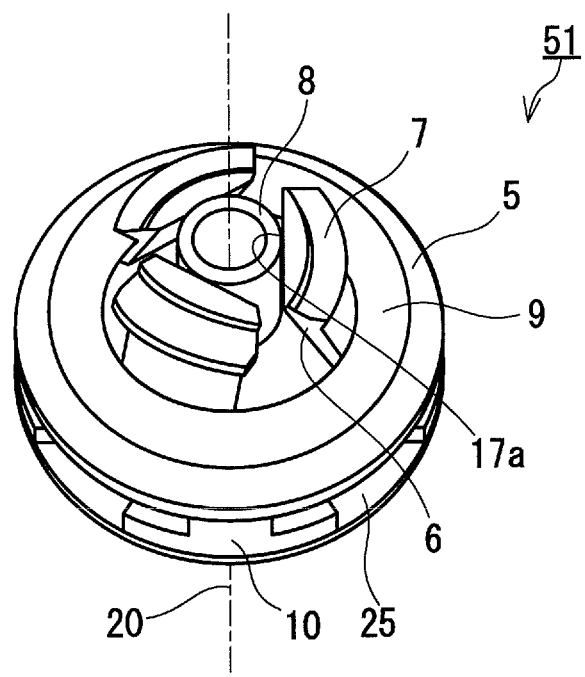
FIG. 8B is a perspective view showing a stopper portion stopping a bend in insertion portions in the ventilation member of FIGS. 7A and 7B.

As illustrated in FIGS. 7A and 7B, the stopper portion 8 is a columnar portion extending from the supporting portion 5. The stopper portion 8 is disposed between the insertion portion 6 and the central axis 20, as viewed from below along the central axis 20. More specifically, the stopper portion 8 is disposed to overlap the central axis 20, as viewed from below along the central axis 20. The support 2 of Second Embodiment is more easily moldable than the support 2 of First Embodiment. With the stopper portion 8, the insertion portions 6 having bent in the direction closer to the central axis 20 upon being inserted into the opening 12 make contact with the stopper portion 8, and the stopper portion 8 restricts the bending of the insertion portions 6 in the direction within the elastically deformable range of the insertion portions 6 (see FIGS. 8A and 8B). FIGS. 8A and 8B represent bending of the insertion portions 6 being restricted in this range by the stopper portion 8 contacting the insertion portions 6. As a result of making a large bend in the direction closer to the central axis 20, the insertion portions 6 contact the stopper portion 8 at the ends 17a of inner side surfaces 17.

The stopper portion 8 is disposed to overlap the through hole 4, as viewed from below along the central axis 20. Inside of the stopper portion 8 has an air passage that is cylindrical, more specifically, tubular in shape and is in communication with the through hole 4. In other words, the tubular space inside the stopper portion 8, which is cylindrical in shape, is in communication with the through hole 4, forming an air passage.

The inner side surfaces 17 of the insertion portions 6 are flat. Having a flat inner side surface is preferable for the same reason described in First Embodiment. Another reason is that the insertion portions 6, with flat inner side surfaces, are able to contact the stopper portion 8 even with a small bend, and enable the stopper portion 8 to more reliably restrict the bending of the insertion portions 6 when the insertion portions 6 are inserted into the opening 12. Another advantage of the insertion portions 6 having the flat inner side surfaces 17 is that it allows the stopper portion 8 to be more freely designed. For example, with the insertion portions 6 having the flat inner side surfaces 17, the outer diameter of the cylindrical stopper portion 8 can be changed more easily.

In the ventilation member 51, the insertion portions 6 and the stopper portion 8 may be shaped and disposed so that all insertion portions 6 do not contact the stopper portion 8 when all hooks 7 are passing through the opening 12, as in First Embodiment.

Third Embodiment

Figure 9A:
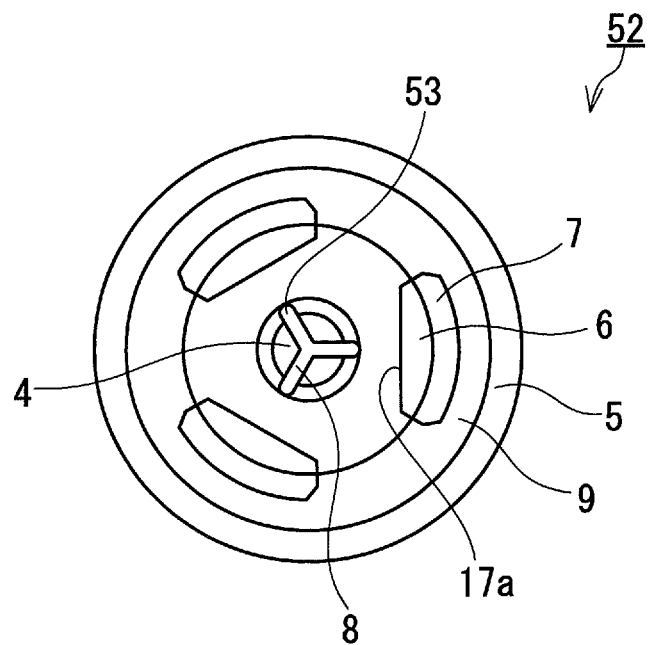
FIG. 9A is a bottom view representing yet another example of a ventilation member of the present invention.
Figure 9B:
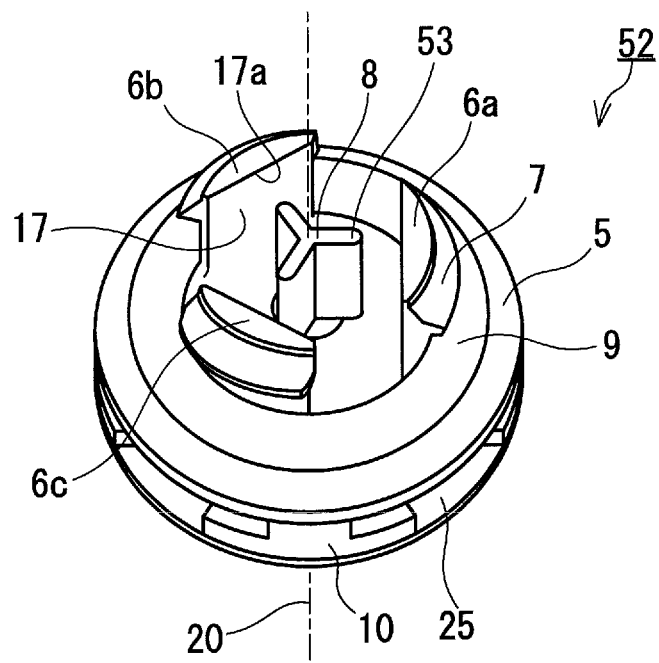
FIG. 9B is a perspective view of the ventilation member shown in FIG. 9A.

FIGS. 9A and 9B show a ventilation member 52 of Third Embodiment. Third Embodiment is the same as Second Embodiment, except for the cross sectional shape of the stopper portion 8, a columnar portion provided independently from the insertion portions 6 as a part of the supporting portion 5 and extending from the supporting portion 5. Another difference is that the stopper portion 8 does not have the air passage. Accordingly, the present embodiment will not be described with regard to features already described in Second Embodiment.

Figure 10A:
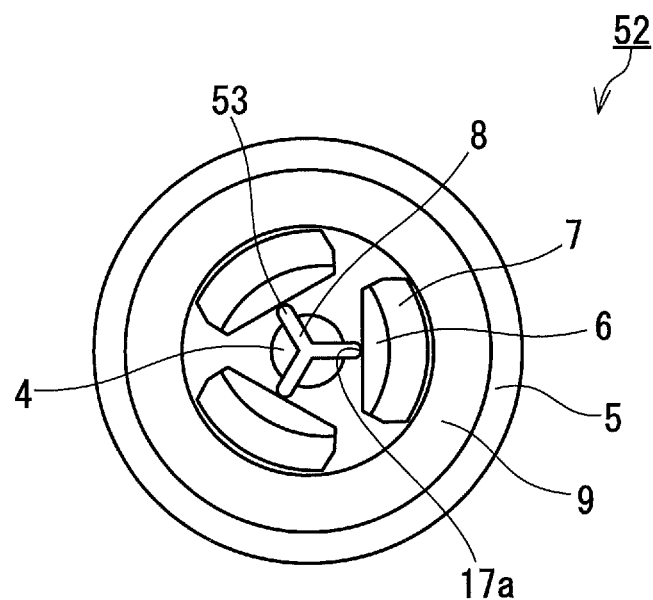
FIG. 10A is a bottom view showing a stopper portion stopping a bend in insertion portions in the ventilation member of FIGS. 9A and 9B.
Figure 10B:
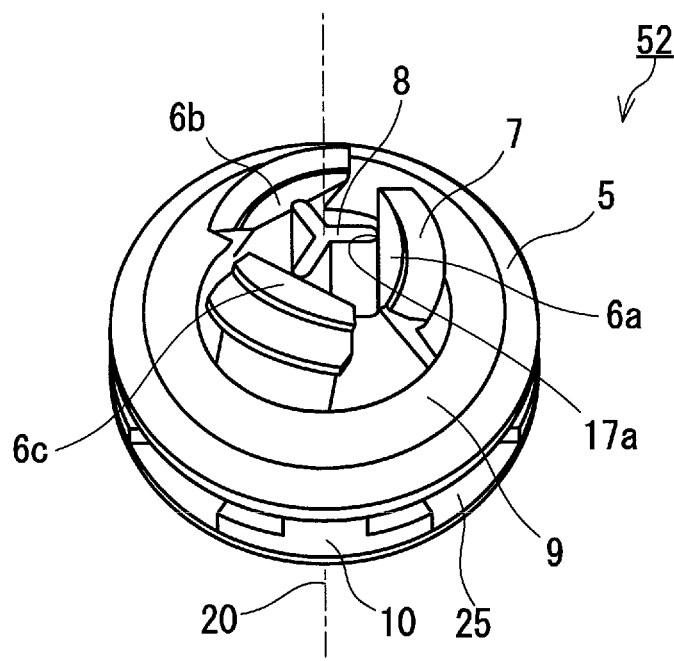
FIG. 10B is a perspective view showing a stopper portion stopping a bend in insertion portions in the ventilation member of FIGS. 9A and 9B.

As illustrated in FIGS. 9A and 9B, the stopper portion 8 has a star-shaped cross section with protruding portions 53 projecting out from the central axis 20 in three directions. The stopper portion 8 is disposed to overlap the through hole 4, as viewed from below along the central axis 20. The stopper portion 8 joins the bottom surface of the supporting portion 5 at the three protruding portions 53. The three protruding portions 53 project out in a direction closer to the inner side surface 17 of the insertion portion 6a, 6b, or 6c, as viewed from below along the central axis 20. The angle between the adjacent protruding portions 53 is 120 degrees, and is the same for all protruding portions 53, as viewed from below along the central axis 20. With the stopper portion 8, the insertion portions 6 having bent in the direction closer to the central axis 20 upon being inserted into the opening 12 make contact with the stopper portion 8, and the stopper portion 8 restricts the bending of the insertion portions 6 in the direction within the elastically deformable range of the insertion portions 6 (see FIGS. 10A and 10B). FIGS. 10A and 10B represent bending of the insertion portions 6 being restricted in this range by the stopper portion 8 contacting the insertion portions 6. As a result of making a large bend in the direction closer to the central axis 20, the insertion portions 6 contact the stopper portion 8 at the ends 17a of the inner side surfaces 17. Because of the foregoing cross sectional shape, the stopper portion 8 itself is hardly bendable, and is able to spread and distribute the applied force on one of the protruding portions 53 to the other two protruding portions 53 when only one of the insertion portions 6a has contacted one of the protruding portions 53. This ensures that the stopper portion 8 itself is restrained from bending upon contacting the insertion portions 6, making it possible to more reliably restrict the bending of the insertion portions 6.

In the ventilation member 52, the insertion portions 6 and the stopper portion 8 may be shaped and disposed so that all insertion portions 6 do not contact the stopper portion 8 when all hooks 7 are passing through the opening 12, as in the foregoing embodiments.

Fourth Embodiment

Figure 11A:
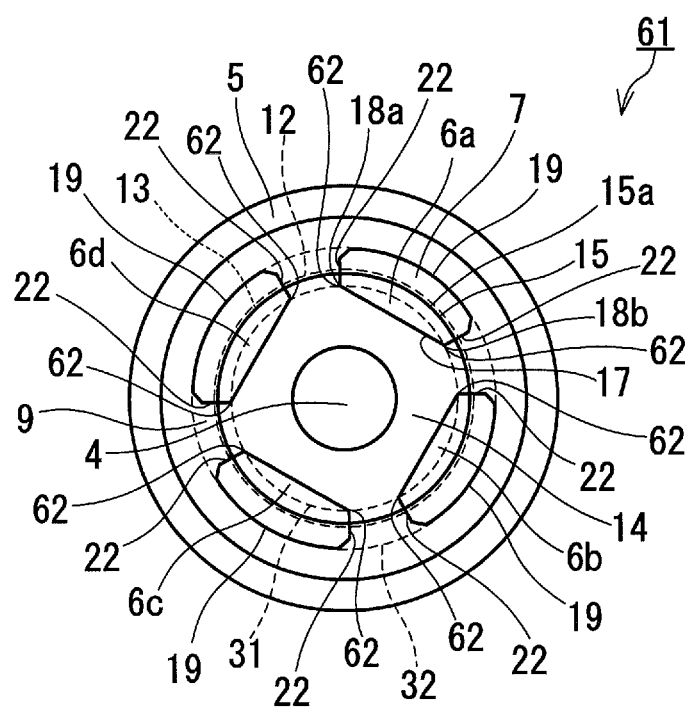
FIG. 11A is a bottom view representing still another example of a ventilation member of the present invention.
Figure 11B:
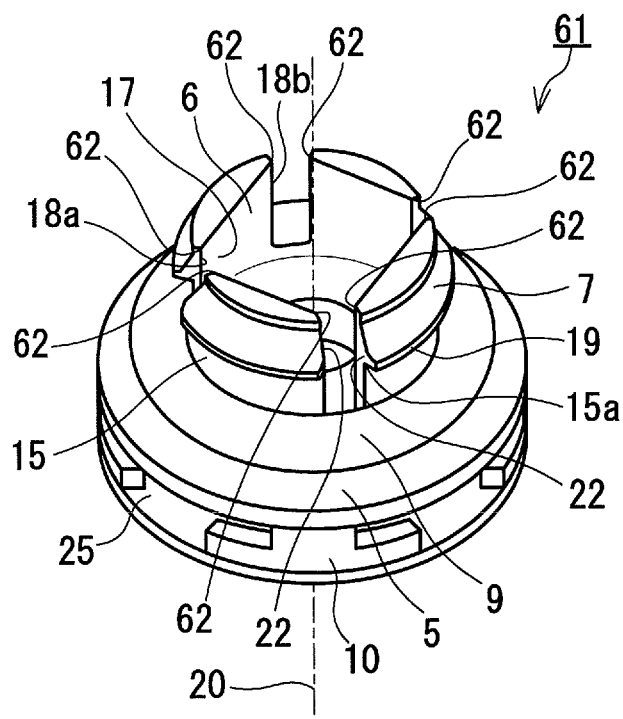
FIG. 11B is a perspective view of the ventilation member shown in FIG. 11A.

FIGS. 11A and 11B show a ventilation member 61 of Fourth Embodiment. As illustrated in FIGS. 11A and 11B, the ventilation member 61 of the present embodiment has a support 2 that includes two or more insertion portions 6, specifically, four insertion portions 6a, 6b, 6c, and 6d. The insertion portions 6 each have a stopper portion 62 at the end portions of side surfaces 22. The stopper portions 62 in the ventilation member 61 of Fourth Embodiment are provided as a part of the insertion portions 6, instead of being independently provided from the insertion portions 6 as in the stopper portions 8 of the ventilation members 1, 51, and 52 of First to Third Embodiments. The insertion portions 6 are disposed by being equally spaced apart along a circle 13, with the outer circumferential surfaces 15 of the insertion portions 6 lying on the circle 13, as viewed from below along the central axis 20. The insertion portions 6 are disposed in a circular region 14 having the same circumference as the circle 13. The insertion portions 6 may be disposed by being unequally spaced apart along the circle 13, with the outer circumferential surfaces 15 of the insertion portions 6 lying on the circle 13, as viewed from below along the central axis 20.

Figure 12A:
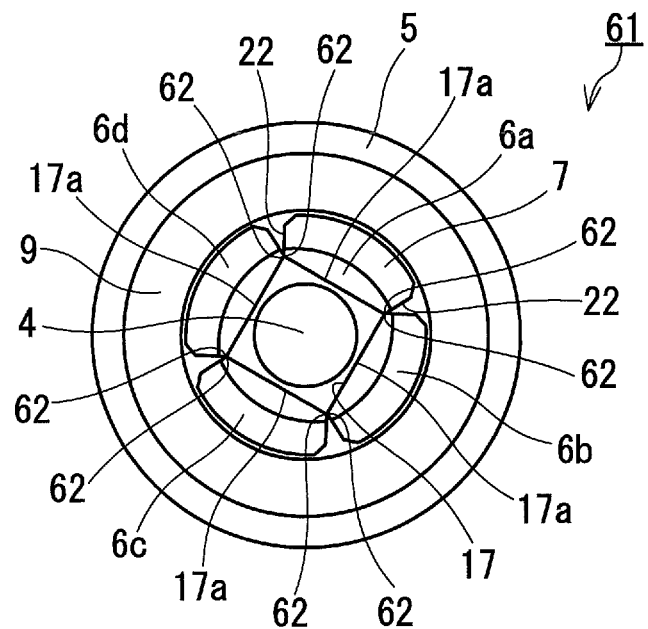
FIG. 12A is a bottom view showing stopper portions stopping a bend in insertion portions in the ventilation member of FIGS. 11A and 11B.
Figure 12B:
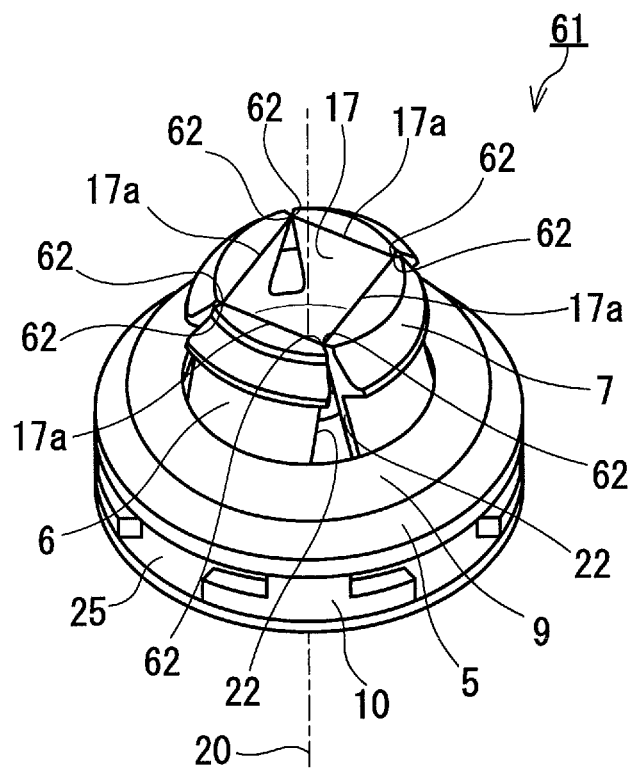
FIG. 12B is a perspective view showing stopper portions stopping a bend in insertion portions in the ventilation member of FIGS. 11A and 11B.
Figure 13:
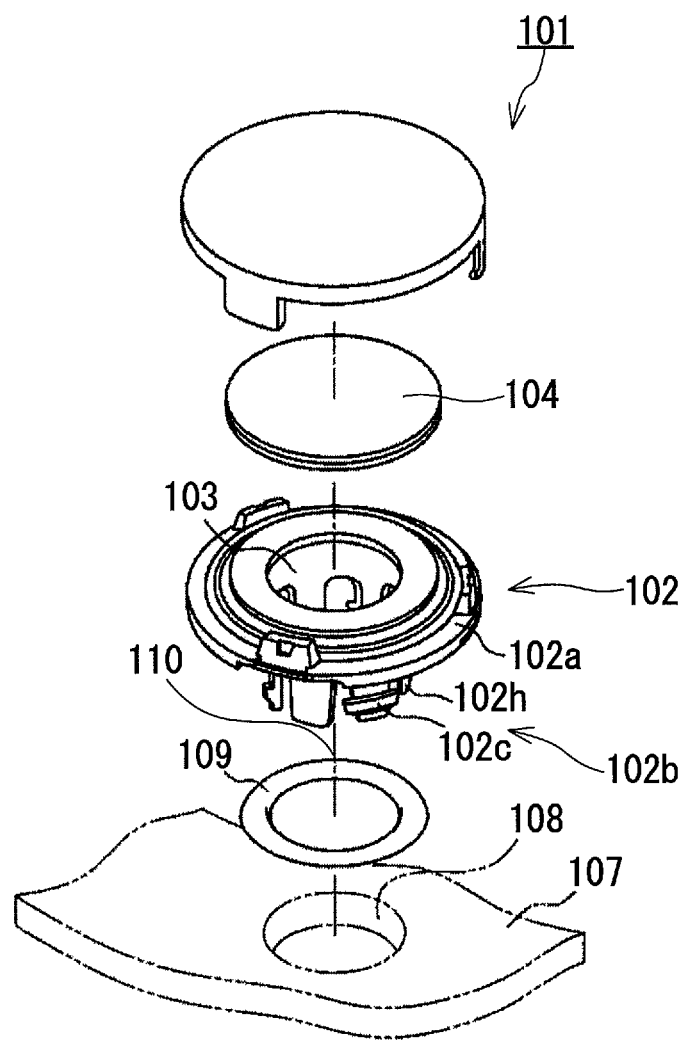
FIG. 13 is an exploded perspective view representing an example of a traditional ventilation member.

FIGS. 12A and 12B show the insertion portions 6a, 6b, 6c, and 6d of the ventilation member 61 having equally bent in the direction closer to the central axis 20 within the elastically deformable range of the insertion portions 6a, 6b, 6c, and 6d, with the stopper portions 62 of the adjacent insertion portions 6a, 6b, 6c, and 6d being in contact with each other. (Hereinafter, this feature of the ventilation member 61 will be referred to as "feature A".) That is, in the ventilation member 61, the insertion portions 6 are restricted within their elastically deformable range by the stopper portions 62 that make contact with each other between the adjacent insertion portions 6 when the insertion portions 6 bend in the direction when inserted into the opening 12 of the housing 11. In this way, the bend in the insertion portions 6 can be reliably removed after the hooks 7 pass through the opening 12. As used herein, the insertion portions 6a, 6b, 6c, and 6d being equally bent means that, for example, the inner side surfaces 17 of the insertion portions 6a, 6b, 6c, and 6d, specifically, the ends 17a of the inner side surfaces 17 are bent by the same distance in the direction, as viewed from below along the central axis 20. In the ventilation member 101 of Patent Literature 1, the leg portions 120h having hooks 102c do not make contact with the adjacent leg portions 102h even when the leg portions 102h having hooks 102c make a large bend when inserted into the opening 108.

The stopper portions 62 may be located at portions of the side surfaces 22 of the insertion portions 6 other than the end portions, or may be provided at any other part of the insertion portions 6 other than the side surfaces 22, provided that the feature A is satisfied.

In the present embodiment, the ventilation member 61 has, for example, three to six insertion portions 6. Preferably, the ventilation member 61 of the present embodiment has four or five insertion portions 6 because it enables the stopper portions 62 to more reliably provide the feature A, in addition to reducing the resistance against the insertion into the opening 12 while preventing detachment of the ventilation member 61 from the opening 12.

The insertion portions 6 may have any configuration, as long as the feature A is satisfied.

The members and portions described in Fourth Embodiment with the same reference numerals as those described in First Embodiment may have the same configurations as their counterparts in First Embodiment, provided that the feature A is satisfied.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

A ventilation member of the present invention can be used for the same applications where traditional ventilation members are used.

REFERENCE SIGNS LIST

1: Ventilation member
2: Support
3: Air-permeable membrane
4: Through hole
5: Supporting portion
6: Insertion portion
6a, 6b, 6c: Insertion portion
7: Hook
8: Stopper portion
9: Sealing member
10: Protecting cover
11: Housing
12: Opening
13: Circle
14: Region
15: Outer circumferential surface
16: Wall surface
17: Inner side surface
17a: End
18a, 18b: End portion
19: Protruding end
20: Central axis
21: Force
22: Side surface
22a: Portion
23: Circle
24: Outer circumferential surface
25: Opening
31: Circle
32: Circle
51: Ventilation member
52: Ventilation member
53: Protruding portion
61: Ventilation member
62: Stopper portion 101: Ventilation member
102: Support
102a: Supporting portion
102b: Insertion portion
102c: Hook
102h: Leg portion
103: Through hole
104: Air-permeable membrane
107: Housing
108: Opening
109: Sealing member

The invention claimed is:

1. A ventilation member configured to be attached to an opening of a housing, the ventilation member comprising:
   a support having a through hole that serves as an air passage between inside and outside of the housing upon attaching the support to the opening; and
   an air-permeable membrane disposed on the support and closing the through hole,
   the support comprising:
      a supporting portion in which the through hole is provided and at which the air-permeable membrane is disposed, and
      an insertion portion extending from the supporting portion and having an end with a hook, wherein the insertion portion bends in a direction toward a central axis of the ventilation member while the hook is passing through the opening by being inserted into the opening, and fixes the ventilation member to the opening with the hook engaging the housing after passing through the opening,
   the ventilation member further comprising:
   a stopper portion configured to restrict the bending of the insertion portion in the direction toward the central axis within an elastically deformable range of the insertion portion during the insertion into the opening, and
   a sealing member disposed around the insertion portion,
   wherein in the supporting portion,
   the stopper portion is independent from the insertion portion, and the stopper portion restricts bending of the insertion portion in the direction toward the central axis within the elastically deformable range of the insertion portion by making contact with the insertion portion bending in the direction toward the central axis during the insertion into the opening,
   the stopper portion is a columnar portion extending from the supporting portion, a dimension of the stopper portion in a circumferential direction being constant from a proximal end to a distal end,
   the support has two or more of the insertion portions,
   said two or more of the insertion portions being disposed to overlap an imaginary circle centered on the central axis, and being separated from one another along the circle as viewed along the central axis from the end side of the insertion portions,
   the stopper portion being disposed to overlap the circle and lie between a pair of the insertion portions that are adjacent one another along the circle, as viewed along the central axis from the end side of the insertion portions,
   the insertion portions have round outer circumferential surfaces,
   the insertion portions have planar inner side surfaces, and
   each of the inner side surfaces of the insertion portions has a portion that protrudes into an inner side of an imaginary circle centered on the central axis and running through end portions of the inner side surface in a width direction of the inner side surface, as viewed along the central axis from the end side of the insertion portions.

2. The ventilation member according to claim 1, wherein the stopper portion is the columnar portion extending from the supporting portion.

3. The ventilation member according to claim 1, wherein an imaginary circle centered on the central axis and contacting an outer circumferential surface of the stopper portion has a diameter equal to or less than the diameter of an imaginary circle centered on the central axis and contacting outer circumferential surfaces of the insertion portions, as viewed along the central axis from the end side of the insertion portions.

4. The ventilation member according to claim 1, wherein the ventilation member further comprises a protecting cover for protecting the air-permeable membrane.

* * * * *